United States Patent
Lee et al.

(10) Patent No.: US 8,350,302 B2
(45) Date of Patent: Jan. 8, 2013

(54) ORGANIC LIGHT EMITTING DISPLAY APPARATUS

(75) Inventors: Sun-Young Lee, Yongin (KR); Jong-Hyuk Lee, Yongin (KR); Yoon-Hyeung Cho, Yongin (KR); Min-Ho Oh, Yongin (KR); Byoung-Duk Lee, Yongin (KR); So-Young Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 124 days.

(21) Appl. No.: 12/917,032

(22) Filed: Nov. 1, 2010

(65) Prior Publication Data

US 2011/0114954 A1    May 19, 2011

(30) Foreign Application Priority Data

Nov. 19, 2009 (KR) .................. 10-2009-0112195

(51) Int. Cl.
*H01L 29/80* (2006.01)
(52) U.S. Cl. ............ 257/257; 257/72; 257/83; 257/290; 257/E31.053
(58) Field of Classification Search .............. 257/72, 257/83, 257, 290
See application file for complete search history.

(56) References Cited

U.S. PATENT DOCUMENTS

| | | | |
|---|---|---|---|
| 2001/0048064 A1* | 12/2001 | Kitani | 250/208.1 |
| 2004/0259389 A1* | 12/2004 | Yamazaki et al. | 438/795 |
| 2006/0082299 A1* | 4/2006 | Yang | 313/512 |
| 2006/0226419 A1 | 10/2006 | Birnstock et al. | |
| 2008/0012477 A1 | 1/2008 | Koo et al. | |
| 2008/0012479 A1 | 1/2008 | Yoo et al. | |
| 2009/0134782 A1* | 5/2009 | Kim | 313/504 |
| 2010/0117525 A1 | 5/2010 | Warashina et al. | |

FOREIGN PATENT DOCUMENTS

| | | |
|---|---|---|
| JP | 2002-117972 | 4/2002 |
| JP | 2008021653 | 1/2008 |
| JP | 2008249839 | 10/2008 |
| KR | 10-2006-0089470 | 8/2006 |
| KR | 10-2007-0051500 | 5/2007 |
| KR | 10-2007-0077010 | 7/2007 |
| KR | 1020080001749 | 1/2008 |
| KR | 10-2008-04539 | 2/2008 |
| KR | 10-2008-0021080 | 3/2008 |
| KR | 1020080021650 | 3/2008 |

OTHER PUBLICATIONS

Korean Office Action dated Apr. 8, 2011 in application No. 10-2009-0112195.

* cited by examiner

*Primary Examiner* — Wai Sing Louie
(74) *Attorney, Agent, or Firm* — Knobbe Martens Olson & Bear LLP

(57) ABSTRACT

An organic light emitting display apparatus is disclosed. The organic light emitting display apparatus includes: a substrate, a seal facing the substrate, bonded to the substrate, a display area disposed on the substrate configured to produce an image, a pad area disposed on the substrate, present on at least one side of the display area, an insulating layer directly extending from the display area, formed on the pad area, a first adhesive layer surrounding the display area, which bonds the substrate to the seal, and comprising an organic material, and a second adhesive layer insulated from the pad area by the insulating layer, disposed outside the first adhesive layer, which bonds the substrate to the seal.

19 Claims, 2 Drawing Sheets

ORGANIC LIGHT EMITTING DISPLAY APPARATUS

CROSS-REFERENCE TO RELATED APPLICATIONS

This application claims the benefit of Korean Patent Application No. 10-2009-0112195, filed on Nov. 19, 2009, in the Korean Intellectual Property Office, the disclosure of which is incorporated herein in its entirety by reference.

BACKGROUND

1. Field

The present field relates to an organic light emitting display apparatus that is capable of preventing permeation of oxygen and water vapors, manufactured using a low temperature bonding process.

2. Description of the Related Technology

Organic light emitting display apparatuses generally include a pixel electrode, an opposite electrode, and an organic light emitting layer interposed between the pixel electrode and the opposite electrode. When a voltage is applied to the pixel electrode and the opposite electrode, holes injected from the pixel electrode are combined with electrons injected from the opposite electrode in the organic light emitting layer, thereby forming excitons. The formed excitons are transitioned to a ground state, thereby generating energy. The organic light emitting layer emits light in response to the generated energy, and thus an image is formed.

Organic light emitting display apparatuses can generally be manufactured to have an ultra-thin flexible form according to their operational characteristics. Due to these features, much research has been performed on further developing such apparatuses.

Organic light emitting display apparatuses generally deteriorate due to permeation of external oxygen and water vapors. This problem can usually be resolved by sealing the organic light emitting display apparatuses with an inorganic sealant such as frit. A sealing process using frit, generally requires a high-temperature bonding process for hardening frits, which damages the organic light emitting display apparatuses. Such sealing processes also usually require laser irradiation of relatively long duration. Thus, sealing processes using frits are generally not well-suited for large-area substrates, and generally result in a rigidity decrease of manufactured devices.

SUMMARY OF CERTAIN INVENTIVE ASPECTS

Embodiments of the present invention provide an organic light emitting display apparatus that is capable of preventing permeation of oxygen and water vapors, and are manufactured using a low temperature process, thereby lowering costs.

One aspect is an organic light emitting display apparatus including: a substrate, a seal facing the substrate, bonded to the substrate, a display area disposed on the substrate configured to produce an image, a pad area disposed on the substrate, present on at least one side of the display area, an insulating layer directly extending from the display area, formed on the pad area, a first adhesive layer surrounding the display area, which bond the substrate to the seal, and including an organic material, and a second adhesive layer insulated from the pad area by the insulating layer, disposed outside the first adhesive layer, which bond the substrate to the seal.

Another aspect is an organic light emitting display apparatus including: a substrate, a seal facing the substrate, which is bonded to the substrate, a display area disposed on the substrate, a thin film transistor area including a plurality of thin film transistors disposed on the substrate, an organic light emitting device area including a plurality of organic light emitting devices, a pad area disposed on the substrate, present on at least one side of the display area, an insulating layer directly extending from the display area, formed on the pad area, a first adhesive layer surrounding the display area, which bonds the substrate to the seal, and including an organic material, and a second adhesive layer insulated from the pad area by the insulating layer, disposed outside the first adhesive layer, which bonds the substrate to the seal.

BRIEF DESCRIPTION OF THE DRAWINGS

The above and other features and advantages of embodiments of the present invention will become more apparent by describing in detail certain exemplary embodiments with reference to the attached drawings in which.

DETAILED DESCRIPTION OF CERTAIN INVENTIVE EMBODIMENTS

Figure 1:
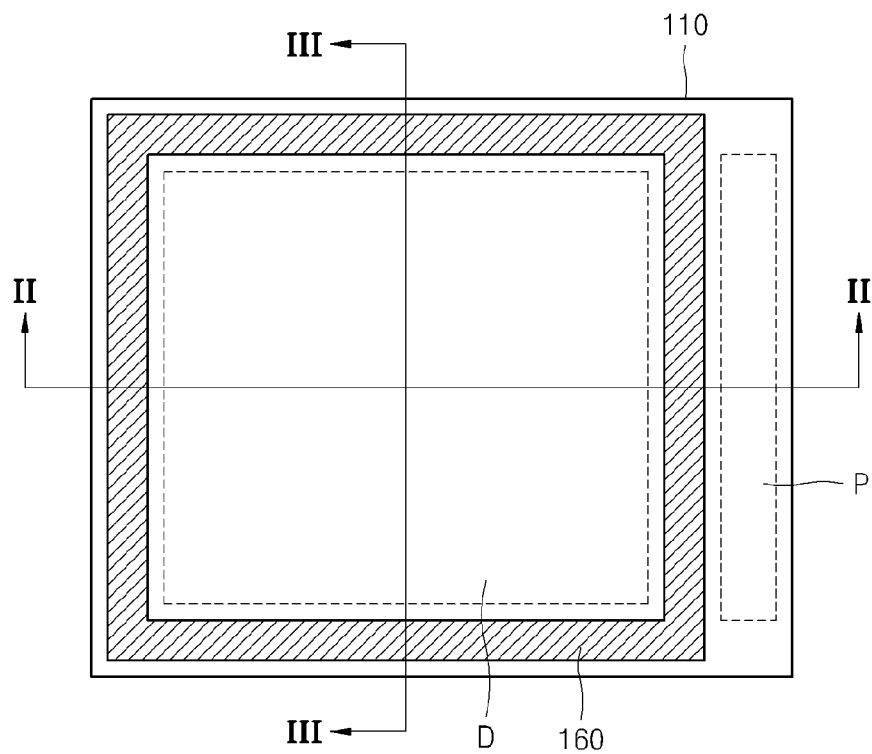
FIG. 1 is a schematic plan view of a portion of an organic light emitting display apparatus including a seal, according to an embodiment of the present invention.

Hereinafter, certain embodiments of the present invention will be described in detail with reference to the attached drawings.

Referring to FIGS. 1 through 4, an embodiment of an organic light emitting display apparatus includes a display area D and a pad area P formed on a surface of a substrate 110 facing a seal 120. In one embodiment, the display apparatus also includes a first adhesive layer 160 and a second adhesive layer 170 surrounding the display area D, wherein the first adhesive layer 160 is located closer to the display area D than the second adhesive layer 170.

In some embodiments, the display area D includes an organic light emitting device (OLED) area 150 including a plurality of OLEDs (not shown) and a TFT area 130 including a plurality of thin film transistors (TFTs) (not shown) connected to the OLEDs. In some embodiments, the OLEDs are not driven by TFTs, and the organic light emitting display apparatus are passive matrix (PM) organic light emitting display apparatuses; in other embodiments, the OLEDs are driven by TFTs, and the organic light emitting display apparatuses are active matrix (AM) organic light emitting display apparatuses. Hereinafter, active matrix OLED apparatus embodiments will be described in detail.

In some embodiments, the substrate 110 and the seal 120 may each be a transparent glass substrate mainly composed of $SiO_2$. In other embodiments, the substrate 110 and the seal 120 may each be a plastic substrate. In particular circumstances, the substrate 110 or the seal 120 may be a transparent glass substrate while the other of the substrate or the seal is a plastic substrate.

In some embodiments, a buffer layer 111 may be formed on the substrate 110 in order to planarize the substrate 110 and prevent permeation of impurity elements into the substrate 110. The buffer layer 111 may include at least one of $SiO_2$ and SiNx.

The TFT area 130 may include an active layer 131, and the active layer 131 may be formed on the buffer layer 111 and may include a semiconductor material. The active layer 131 may include an inorganic semiconductor, such as an amorphous silicon or a poly silicon, or an organic semiconductor. The active layer 131 includes a source region 131b, a drain region 131c, and a channel region 131a between the source region 131b and the drain region 131c. The active layer 131 is covered by a gate insulating layer 112.

A gate electrode 133 is formed on the gate insulating layer 112, and covered by an interlayer insulating layer 113. A source electrode 135 and a drain electrode 136 may be formed on the interlayer insulating layer 113, and covered by a passivation layer 114 and a planarization layer 115.

The gate insulating layer 112, the interlayer insulating layer 113, the passivation layer 114, and the planarization layer 115 may each include an insulating material, and may each have a single or multi-layer structure including at least one of an inorganic material, and an organic material. In some embodiments, the structure of the TFT area 130 may be different than the one described above.

The pad area P is located outside the display area D. The pad area P includes a plurality of pad electrodes 180, and the pad electrodes 180 are each connected to various lines (not shown), such as a data line, a scan line, or a power supply line, for driving a display device, included in the display area D. The pad electrodes transfer outer signals to the OLEDs of the display area D through the respective lines. The pad electrodes 180 may be formed together with the gate electrode 133, or source and drain electrodes 135 and 136 of the TFT.

Figure 2:
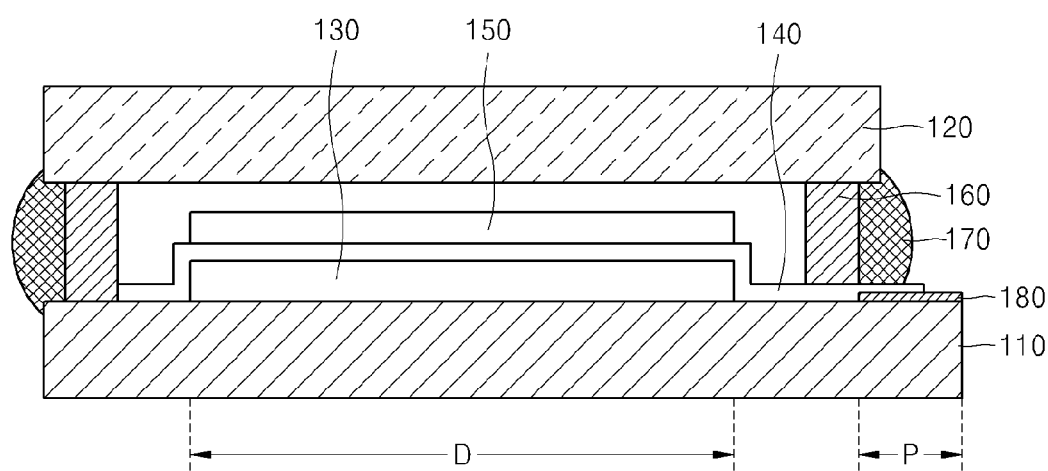
FIG. 2 is a schematic cross-sectional view taken along line II-II of FIG. 1.

In some embodiments, the pad area P may be located on one side of the display area D, as illustrated in FIGS. 1 and 2. In other embodiments, the pad area P may be located on more than one side of the display area D.

Figure 3:
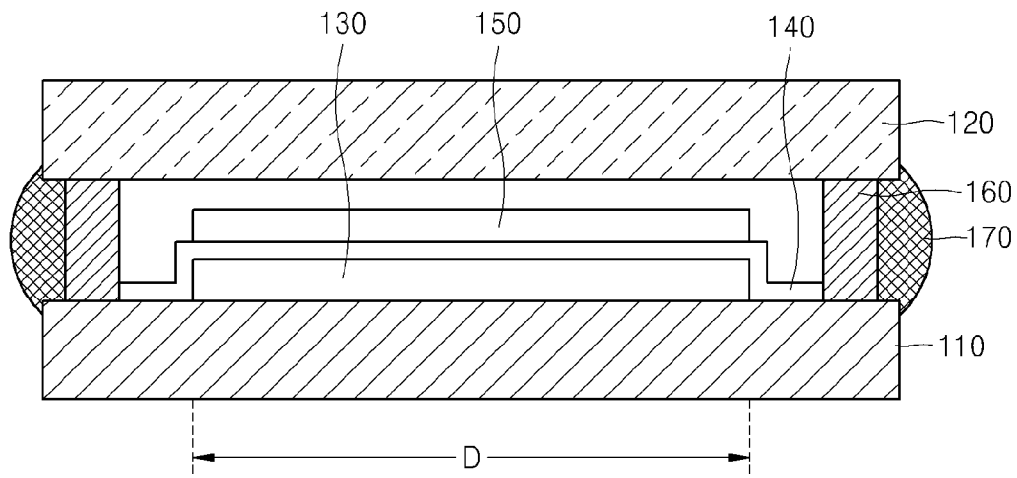
FIG. 3 is a schematic cross-sectional view taken along line of FIG. 1.
Figure 4:
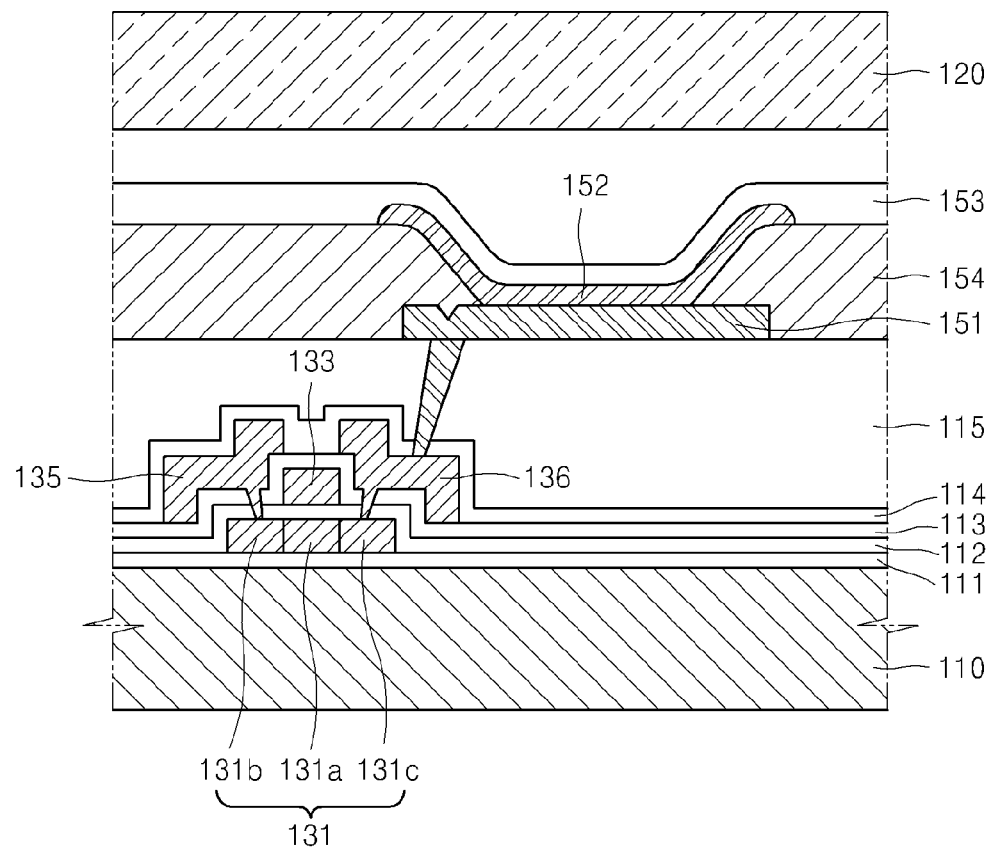
FIG. 4 is a cross-sectional view of an active matrix organic light emitting display apparatus including a display unit, wherein the display unit is illustrated in detail.

An insulating layer 140 may directly extend from the display area D to a portion of the pad area P. In the embodiment of FIGS. 2 and 3, the insulating layer 140 directly extends from between the TFT unit 130 and the OLED unit 150 of the display area D. In other embodiments, the insulating layer 140 may directly extend from the TFT unit 130 of the display area D.

The insulating layer 140 is formed by directly extending a plurality of insulating layers used to form a TFT. In some embodiments, at least one insulating layer may be selected from the group consisting of the gate insulating layer 112, the interlayer insulating layer 113, the passivation layer 114, and the planarization layer 115. When the gate insulating layer 112, the interlayer insulating layer 113, the passivation layer 114, and the planarization layer 115 are formed on the display area D, at least one of them is simultaneously deposited on the pad area D, thereby forming the insulating layer 140. Thus, the insulating layer 140 may include at least one of an inorganic material, and an organic material.

Since the insulating layer 140 formed on the portion of the pad area P covers a portion of the exposed pad electrode 180, the insulating layer 140 insulates the second adhesive layer 170 from the pad electrode 180.

A first electrode 151, which acts as an anode of the OLED, is formed on the planarization layer 115, and is covered by a pixel defining layer 154. The pixel defining layer 154 includes an insulating material. An opening is formed in the pixel defining layer 154, and an organic light emitting layer 152 of the OLED is formed in a region defined by the opening. A second electrode 153, which acts as a cathode of the OLED, covers all the pixels. In other embodiments, the first electrode 151 may act as a cathode and the second electrode 153 may act as an anode.

The first electrode 151 may be a transparent electrode or a reflective electrode. In embodiments where the first electrode 151 is a transparent electrode, the first electrode 151 may include indium tin oxide (ITO), indium zinc oxide (IZO), zinc oxide (ZnO), or indium oxide ($In_2O_3$). In embodiments where the first electrode 151 is a reflective electrode, the first electrode 151 may include a reflective layer including Ag, Mg, Al, Pt, Pd, Au, Ni, Nd, Ir, Cr, or a mixture thereof and a transparent layer including ITO, IZO, ZnO, or $In_2O_3$.

The second electrode 153 may be a transparent electrode or a reflective electrode. In embodiments where the second electrode 153 is a transparent electrode, the second electrode 153 may include: a layer formed by depositing Li, Ca, LiF/Ca, LiF/Al, Al, Mg, or a mixture thereof; and an auxiliary electrode or bus electrode line which includes a transparent conductive material such as ITO, IZO, ZnO, or $In_2O_3$, wherein the layer faces the organic light emitting layer 152. In embodiments where the second electrode 153 is a reflective electrode, the second electrode 153 may include Li, Ca, LiF/Ca, LiF/Al, Al, Mg, or a mixture thereof.

The organic light emitting layer 152 interposed between the first electrode 151 and the second electrode 153 may include a low molecular weight organic material or a polymer organic material. In embodiments where the organic light emitting layer 152 includes a low molecular weight organic material, a hole injection layer (HIL) (not shown), a hole transport layer (HTL) (not shown), an electron transport layer (ETL) (not shown), and an electron injection layer (EIL) (not shown) may be formed between the first electrode 151 and the second electrode 153, wherein the HIL and HTL are formed under the organic light emitting layer 152 and the ETL and EIL are formed above the organic light emitting layer 152. Each of the HIL, the HTL, the ETL, and the EIL may have a single-layer structure or a multi-layer structure. Examples of the low molecular weight organic material may include copper phthalocyanine (CuPc), N,N'-di(naphthalene-1-yl)-N,N'-diphenyl-benzidine (NPB), and tris-8-hydroxyquinoline aluminum (Alq3). These low molecular weight organic materials may be vacuum-deposited through a mask to form the organic light emitting layer 152.

In embodiments where the organic light emitting layer 152 includes a polymer organic material, a hole transport layer (HTL) (not shown) may be formed between the organic light emitting layer 152 and the anode. The HTL may include Poly(3,4-ethylenedioxythiophene) (PEDOT), and the organic light emitting layer 152 may include a polymer organic material such as a poly-phenylenevinylene (PPV) material or a polyfluorene material.

The first adhesive layer 160 is disposed outside the display area D on the substrate 110 and surrounds the display area D. The first adhesive layer 160 may be formed by coating and hardening an epoxy-based organic material sealant, and may be used to bond the substrate 110 to the seal 120.

Generally, when adhesive layers are formed using an inorganic sealant such as frits, permeation of water vapor and oxygen, which results in deterioration of an OLED, may be prevented. However, a long laser irradiation time is required with such sealants, which is not well-suited for manufacturing large-area display apparatuses. In addition, heat generated during laser irradiation may have a temperature of 400° C. or more, and thus an OLED may be damaged by the generated heat.

According to some embodiments, the first adhesive layer 160 is formed using an organic material sealant such as an epoxy material. Thus, no laser irradiation is required and the manufacturing time is reduced. In addition, unlike devices manufactured with frangible frits, devices manufactured with organic material sealants may have high rigidity. However, the organic material sealant is less effective to prevent permeation of water vapors and gas than frits.

In order to effectively prevent permeation of water vapors and gas, the organic light emitting display apparatus according to some embodiments may further include a second adhesive layer 170 outside the first adhesive layer 160.

In some embodiments, the second adhesive layer 170 may include a solder material. The solder material may include at least one metal or metal alloy selected from the group consisting of indium (In), tin (Sn), bismuth (Bi), lead (Pb), cadmium (Cd), zinc (Zn), mercury (Hg), silver (Ag), copper (Cu), tellurium (Te), nickel (Ni), cerium (Ce), cesium (Cs), cobalt (Co), silicon (Si), magnesium (Mg), and calcium (Ca).

The second adhesive layer 170 including the solder material may undergo a bonding process, which needs not to be performed at high temperature. The solder material may have a melting point between about 20° C. to about 200° C. In embodiments where an alloy including Cu and Sn is used, the bonding process temperature may be about 20° C., and the bonding process may be performed at a temperature from about 20° C. to about 100° C. for 16 to 48 hours.

The second adhesive layer 170 may surround the first adhesive layer 160. In some embodiments, the second adhesive layer 170 may directly contact the first adhesive layer 160. The second adhesive layer 170 may be formed on the substrate 110 or the seal 120 by coating, dispensing, screen printing, or doctor blading.

Since the first adhesive layer 160 is surrounded by the second adhesive layer 170 including the solder material, permeation of oxygen and water vapors may be effectively prevented. Given that the second adhesive layer 170 is formed at a relatively low temperature, damage to the OLED may be prevented.

The second adhesive layer 170 is conductive since the solder material included therein is metallic. Interconnection lines are present outside the first adhesive layer 160 and the second adhesive layer 170 thus needs to be insulated from the interconnection lines. With the second adhesive layer 170 disposed on the pad area P in which the pad electrode 180 is exposed, insulation is necessary.

In one embodiment, the insulating layer 140 is formed on the portion of the pad area P in which the pad electrode 180 is exposed.

The insulating layer 140 may directly extend from the display area D. Thus, a separate deposition process for forming the insulating layer 140 on the pad area P may not be necessary to be performed. The insulating layer 140 may include at least one material selected from the group consisting of an inorganic material, an organic material, and a composite including an inorganic material and an organic material. In some embodiments, the insulating layer 140 may include an inorganic insulating material having excellent oxygen and water vapor permeation prevention characteristics. In embodiments where an insulating layer directly extending from the passivation layer 114 for protecting a TFT is used as the insulating layer 140 of the pad area P, the insulating layer 140 may include at least one material selected from the group consisting of aluminum oxide (AlO), zinc oxide (ZnO), titanium oxide (TiO$_2$), tantalum oxide (Ta$_2$O$_6$), zirconium oxide (ZrO$_2$), hafnium oxide (HfO$_2$), silicon oxide (SiO$_2$), silicon nitride (SiNx), aluminum nitride (AlN), aluminum oxynitride (AlON), tantalum nitride (TaN), and titanium nitride (TiN).

In some embodiments, the first adhesive layer 160 of the organic light emitting display apparatus includes an organic sealant, which helps reduce manufacturing costs, reduce bonding process time, and improve the rigidity of the manufactured device.

Furthermore, since the second adhesive layer 170 is formed outside the first adhesive layer 160, permeation of oxygen and water vapors is effectively prevented. Since the bonding process of the second adhesive layer 170 is performed at a relatively low temperature, damage to the OLED may be prevented. Since the insulating layer 140 is formed by directly extending from the display area D to the pad area P, the second adhesive layer 170 is insulated from the pad electrode 180 without the need for a separate insulating process.

While certain embodiments of the present invention have been particularly shown and described, it will be understood by those of ordinary skill in the art that various changes in form and details may be made therein without departing from the spirit and scope of the present invention.

What is claimed is:

1. An organic light emitting display apparatus comprising:
   a substrate;
   a seal facing the substrate, bonded to the substrate;
   a display area disposed on the substrate configured to produce an image;
   a pad area disposed on the substrate, present on at least one side of the display area;
   an insulating layer directly extending from the display area, formed on the pad area;
   a first adhesive layer surrounding the display area, which bonds the substrate to the seal, and comprising an organic material; and
   a second adhesive layer insulated from the pad area by the insulating layer, disposed outside the first adhesive layer, which bonds the substrate to the seal.

2. The organic light emitting display apparatus of claim 1, wherein the insulating layer is formed of an inorganic material.

3. The organic light emitting display apparatus of claim 1, wherein the insulating layer comprises at least one of aluminum oxide (AlO), zincoxide (ZnO), titanium oxide (TiO$_2$), tantalum oxide (Ta$_2$O$_6$), zirconium oxide (ZrO$_2$), hafnium oxide (HfO$_2$), silicon oxide (SiO$_2$), silicon nitride (SiNx), aluminum nitride (AlN), aluminum oxynitride (AlON), tantalum nitride (TaN), and titanium nitride (TiN).

4. The organic light emitting display apparatus of claim 1, wherein the first adhesive layer comprises an epoxy material.

5. The organic light emitting display apparatus of claim 1, wherein the second adhesive layer surrounds the first adhesive layer.

6. The organic light emitting display apparatus of claim 5, wherein the second adhesive layer directly contacts the first adhesive layer.

7. The organic light emitting display apparatus of claim 1, wherein the second adhesive layer comprises at least one of indium (In), tin (Sn), bismuth (Bi), lead (Pb), cadmium (Cd), zinc (Zn), mercury (Hg), silver (Ag), copper (Cu), tellurium (Te), nickel (Ni), cerium (Ce), cesium (Cs), cobalt (Co), silicon (Si), magnesium (Mg), and calcium (Ca).

8. The organic light emitting display apparatus of claim 1, wherein a melting point of the second adhesive layer is between about 20° C. and about 200° C.

9. The organic light emitting display apparatus of claim 1, further comprising a buffer layer interposed between the substrate and the display area.

10. The organic light emitting display apparatus of claim 1, wherein the display area comprises:

a thin film transistor area comprising a plurality of thin film transistors disposed on the substrate; and
an organic light emitting device area comprising a plurality of organic light emitting devices, each of the organic light emitting devices comprising:
a first electrode electrically connected to a corresponding thin film transistor;
a second electrode facing the first electrode; and
an organic light emitting layer interposed between the first electrode and the second electrode.

11. The organic light emitting display apparatus of claim 10, wherein the insulating layer is formed with the thin film transistor on the pad area.

12. The organic light emitting display apparatus of claim 10, wherein the thin film transistor area further comprises:
an active layer disposed on a substrate, comprising a source region, a channel region, and a drain region;
a gate insulating layer covering the active layer;
a gate electrode disposed on the gate insulating layer and corresponding to the channel region;
an interlayer insulating layer covering the gate electrode;
a source electrode and a drain electrode disposed on the interlayer insulating layer and respectively connected to the source region and the drain region;
a passivation layer covering the source electrode and the drain electrode; and
a planarization layer disposed on the passivation layer.

13. The organic light emitting display apparatus of claim 12, wherein the insulating layer and the gate insulating layer are formed on the same plane.

14. The organic light emitting display apparatus of claim 12, wherein the insulating layer and the interlayer insulating layer are formed on the same plane.

15. The organic light emitting display apparatus of claim 12, wherein the insulating layer and the passivation layer are formed on the same plane.

16. The organic light emitting display apparatus of claim 15, wherein the passivation layer comprises at least one of aluminum oxide (AlO), zincoxide (ZnO), titanium oxide ($TiO_2$), tantalum oxide ($Ta_2O_6$), zirconium oxide ($ZrO_2$), hafnium oxide ($HfO_2$), silicon oxide ($SiO_2$), silicon nitride (SiNx), aluminum nitride (AlN), aluminum oxynitride (AlON), tantalum nitride (TaN), and titanium nitride (TiN).

17. An organic light emitting display apparatus comprising:
a substrate;
a seal facing the substrate, which is bonded to the substrate;
a display area disposed on the substrate,
a thin film transistor area comprising a plurality of thin film transistors disposed on the substrate;
an organic light emitting device area comprising a plurality of organic light emitting devices;
a pad area disposed on the substrate, present on at least one side of the display area;
an insulating layer directly extending from the display area, formed on the pad area;
a first adhesive layer surrounding the display area, which bonds the substrate to the seal, and comprising an organic material; and
a second adhesive layer insulated from the pad area by the insulating layer, disposed outside the first adhesive layer, which bonds the substrate to the seal.

18. An organic light emitting display apparatus according to claim 17, wherein each of the thin film transistors comprises:
an active layer disposed on a substrate, comprising a source region, a channel region, and a drain region;
a gate insulating layer covering the active layer;
a gate electrode disposed on the gate insulating layer and corresponding to the channel region;
an interlayer insulating layer covering the gate electrode;
a source electrode and a drain electrode disposed on the interlayer insulating layer and respectively connected to the source region and the drain region;
a passivation layer covering the source electrode and the drain electrode; and
a planarization layer disposed on the passivation layer.

19. An organic light emitting display apparatus according to claim 17, wherein each of the organic light emitting devices comprises:
a first electrode electrically connected to a corresponding thin film transistor;
a second electrode facing the first electrode; and
an organic light emitting layer interposed between the first electrode and the second electrode.

* * * * *

UNITED STATES PATENT AND TRADEMARK OFFICE
CERTIFICATE OF CORRECTION

PATENT NO. : 8,350,302 B2  
APPLICATION NO. : 12/917032  
DATED : January 8, 2013  
INVENTOR(S) : Lee et al.

Page 1 of 1

It is certified that error appears in the above-identified patent and that said Letters Patent is hereby corrected as shown below:

In the Specification

Column 2, line 27, change "line" to --line III-III--.

In the Claims

Column 6, line 44, in Claim 3, change "(AIN)," to --(A1N),--.

Column 6, line 44, in Claim 3, change "(AION)," to --(A1ON),--.

Column 7, line 43, in Claim 16, change "(AIN)," to --(A1N),--.

Column 7, line 44, in Claim 16, change "(AION)," to --(A1ON),--.

Signed and Sealed this  
Twenty-second Day of October, 2013

Teresa Stanek Rea  
*Deputy Director of the United States Patent and Trademark Office*